United States Patent
Stanbery

[11] Patent Number: 5,261,969
[45] Date of Patent: Nov. 16, 1993

[54] MONOLITHIC VOLTAGE-MATCHED TANDEM PHOTOVOLTAIC CELL AND METHOD FOR MAKING SAME

[75] Inventor: Billy J. Stanbery, Seattle, Wash.

[73] Assignee: The Boeing Company, Seattle, Wash.

[21] Appl. No.: 869,294

[22] Filed: Apr. 14, 1992

[51] Int. Cl.[5] .................. H01L 31/05; H01L 31/078; H01L 31/18
[52] U.S. Cl. ........................... 136/249; 437/2; 437/5
[58] Field of Search ............ 136/249 TJ; 437/2–5

[56] References Cited

U.S. PATENT DOCUMENTS

| | | | |
|---|---|---|---|
| Re. 31,968 | 8/1985 | Mickelsen et al. | 136/260 |
| 4,234,351 | 11/1980 | Deminet et al. | 136/251 |
| 4,295,002 | 10/1981 | Chappell et al. | 136/244 |
| 4,392,451 | 7/1983 | Mickelsen et al. | 118/690 |
| 4,461,922 | 7/1984 | Gay et al. | 136/249 |
| 4,523,051 | 6/1985 | Mickelsen et al. | 136/260 |
| 4,680,422 | 7/1987 | Stanbery | 136/249 |
| 4,684,761 | 8/1987 | Devany | 136/258 |
| 4,703,131 | 10/1987 | Dursch | 136/258 |
| 4,727,047 | 2/1988 | Bozler et al. | 437/89 |
| 4,776,893 | 10/1988 | McLeod et al. | 136/249 |
| 4,795,501 | 1/1989 | Stanbery | 136/249 |
| 4,835,116 | 5/1989 | Lee et al. | 437/111 |
| 4,846,931 | 7/1989 | Gmitter et al. | 156/633 |
| 4,867,801 | 9/1989 | Stanbery | 136/249 |
| 5,021,099 | 6/1991 | Kim et al. | 136/249 |
| 5,032,538 | 7/1991 | Bozler et al. | 437/83 |
| 5,075,763 | 12/1991 | Spitzer et al. | 357/71 |
| 5,078,804 | 1/1992 | Chen et al. | 136/260 |
| 5,091,018 | 2/1992 | Fraas et al. | 136/246 |
| 5,096,505 | 3/1992 | Fraas et al. | 136/246 |
| 5,118,361 | 6/1992 | Fraas et al. | 136/246 |

FOREIGN PATENT DOCUMENTS

| | | | |
|---|---|---|---|
| 59-161081 | 9/1984 | Japan | 136/249 TJ |
| 61-75567 | 4/1986 | Japan | 136/249 TJ |

OTHER PUBLICATIONS

R. Gale et al., "High-Efficiency Double-Heterostructure AlGaAs/GaAs Solar Cells," *Proceedings of the 18th IEEE PV Specialists Conf.* (IEEE N.Y., 1985, p. 296).

*Primary Examiner*—Aaron Weisstuch
*Attorney, Agent, or Firm*—John C. Hammar

[57] ABSTRACT

A monolithic photovoltaic cell (20) that includes at least one upper cell (24) and two or more lower cells (26) is disclosed. The upper cell is separated from the lower cells by an intrinsic isolation layer (28) to which both the upper and lower cells are bonded. A conductive backplane (30) formed integrally with the upper cell serves as a member of that cell and is actually bonded to the intrinsic isolation layer. Each lower cell is provided with a conductive backplane (32) that functions as the interface between the cell and the intrinsic isolation layer. A selectively applied metallization layer (31) series connects the lower tandem cells together and connects the lower cells in parallel across the upper cell. Dielectric material (48) is applied between the individual photovoltaic cells (24, 26) and the metallization layer to prevent the metallization layer from shorting out the photovoltaic cells. In one embodiment of the invention, the upper photovoltaic cell may be an AlGaAs homojunction photovoltaic cell, the lower cells may be CuInSe$_2$/CdZnS heterojunction photovoltaic cells, and a layer of ZnSe may serve as the isolation layer between the cells. In one version of this embodiment of the invention, the n-regions of the upper and lower cells are located closest to the isolation layer. In one method of manufacture, the upper cell structure is initially epitaxially grown on a wafer, the isolation layer is grown over the upper cell structure, the lower cells are formed over the isolation layer, the entire structure is separated from the wafer and inverted, the upper cell is formed from the upper cell structure, and the upper cell is metallized to connect it to the lower cells.

37 Claims, 8 Drawing Sheets

MONOLITHIC VOLTAGE-MATCHED TANDEM PHOTOVOLTAIC CELL AND METHOD FOR MAKING SAME

FIELD OF THE INVENTION

This application relates to a monolithic, multicell, voltage-matched photovoltaic cell and a method for manufacture and, particularly, to a GaAs/CuInSe$_2$ monolithic tandem cell.

BACKGROUND OF THE INVENTION

A photovoltaic cell is an electrical device formed of semiconducting material able to absorb electromagnetic energy generally from light and convert it directly into electrical energy. An individual photovoltaic cell has a distinct spectrum of light to which it is responsive; the particular spectrum is primarily a function of the material forming the cell. Photovoltaic cells that are responsive to the visible light spectrum are commonly referred to as solar cells.

Individually, any given photovoltaic cell is capable of generating only a relatively small amount of power. For example, some solar cells generate power in the range of 0.004 to 0.02 watts/cm$^2$ surface area. One means of increasing the power generated by a photovoltaic cell is to fabricate a monolithic, tandem solar cell. This type of photovoltaic cell includes at least an upper cell and a lower cell that are stacked together. The upper cell, identified as the upper tandem subcell circuit, is formed of semiconducting material that is responsive to light over a first range of wavelengths but is transparent to light at a second range of wavelengths. The lower cell, identified as the lower tandem subcell circuit, is formed of material responsive to light at a second range of wavelengths. An advantage of these monolithic cells is that they are able to absorb a relatively wide range of incident light and efficiently convert it into electrical energy. This type of photovoltaic cell is capable of generating anywhere from 0.0108 to 0.0403 watts/cm$^2$, twice the power of other photovoltaic cells. U.S. Pat. Nos. Re. 31,968; 4,392,451; 4,523,051; 4,684,761; 4,680,422; 4,795,501; 4,867,801; 5,021,099; and 5,078,804, incorporated herein by reference, disclose how such tandem cells can be manufactured. U.S. Pat. No. 4,867,801 discloses how a triple tandem cell with three photovoltaic regions can be fabricated. U.S. Pat. Nos. 5,091,018 and 5,096,505 further disclose how to manufacture tandem cells wherein the upper and lower cells are attached to a separate substrate.

To date, monolithic tandem cells have been fabricated so that the upper and lower subcell circuits are series connected to each other, because it has proven difficult to provide an isolation layer that can prevent electron flow between the upper and lower tandem subcell circuits. Furthermore, it has been an equally hard challenge to provide transparent backplane connection to the surfaces of the individual subcell circuits that interface each other. Such connection has been especially difficult with regard to the lower tandem subcell circuit. Metals, for example, cannot be used to provide such connection because, if they are formed on the monolithic cell in a layer thin enough to be transparent, they typically do not have sufficient conductivity to allow the current developed by the cell to readily flow therethrough. Finding a transparent semiconducting material that can serve as a backplane connector has proven to be an equally difficult task. Thus, current tandem cells are formed in a series-connected arrangement wherein the current that develops in each subcell circuit flows through the companion subcell circuits A disadvantage of this connection is that the individual subcell circuits forming the monolithic cell must be current matched. In other words, the individual subcell circuit cells must be fabricated so that the same current flows through each cell. If the individual subcell circuits are not so arranged, then the subcell circuit that produces less current will function as a power sink instead of power source, reducing the overall power output of the monolithic cell. Alternatively, the current out of a monolithic cell is limited by the current generated by the subcell circuit that generates the smallest current. This limitation similarly reduces the overall power that is generated by the cell.

Machining monolithic photovoltaic cells has proven to be a difficult task because fabricating the individual subcell circuits so that they are current matched is difficult. Once formed, maintaining the match is difficult because, when the monolithic cell is exposed to ionizing radiation, the semiconducting material forming the individual subcell circuits starts to break down, reducing the current generated. The upper and lower tandem subcell circuits typically break down at different rates. This causes the power generated by the individual subcell circuits to likewise change at different rates. Once this breakdown occurs, the individual cells are no longer current matched and the power produced by the monolithic cell, as a whole, begins to fall appreciably.

SUMMARY OF THE INVENTION

This invention relates to monolithic photovoltaic cells with upper tandem cells voltage matched with one or more lower tandem cells with which the upper cells are paired. Lower tandem cells are series connected to form a lower tandem subcell circuit that has a voltage equal to or greater than that of the upper tandem cell. The upper and lower tandem cells are bonded to the opposed sides of an isolation layer. Conductive backplanes formed integrally with each cell function as terminals that enable the individual cells to be connected together. The upper tandem cell and lower tandem cell arrays are connected in parallel across the isolation layer to form a monolithic photovoltaic cell array wherein the upper and lower tandem cell layers are voltage matched.

One preferred monolithic photovoltaic cell of this invention is formed with a single aluminum gallium arsenide (Al$_x$Ga$_{1-x}$As) homojunction upper tandem cell and at least two copper indium diselenide/cadmium zinc sulfide (CuInSe$_2$/CdZnS) heterojunction lower tandem cells. A layer of zinc selenide (ZnSe) serves as the isolation layer between the upper and lower cells. In one version of this embodiment of the invention, the p-regions of the individual Al$_x$Ga$_{1-x}$As and CuInSe$_2$/CdZnS cells are closest to the isolation layer. In this version of the invention, a layer of aluminum gallium arsenide (Al$_x$Ga$_{1-x}$As) serves as the backplane for the Al$_x$Ga$_{1-x}$As cell and discrete sections of zinc telluride (ZnTe) serve as the backplanes for the CuInSe$_2$/CdZnS cells.

One preferred method of manufacturing the monolithic photovoltaic cell of this invention involves fabricating the cell in an inverted state relative to the direction from which light will strike the assembled cell. According to this method of manufacture, initially, the upper tandem cell is fabricated on a wafer of semiconducting material. After the upper cell is fabricated, the intrinsic isolation layer is grown on the top surface of the wafer. Semiconducting material forming the lower tandem cells is then grown over the isolation layer. Once this semiconductor material is formed, it is selectively sectioned, or patterned, to form a number of discrete lower tandem cells. The lower tandem cells are selectively metallized to form at least one series-connected string of cells. If there is just one series-connected string, that string forms the lower tandem subcell circuit. If there are multiple strings, the strings are connected together to form the lower tandem subcell circuit. Once the lower tandem subcell circuit is formed, a substrate is attached to the exposed, bottom, surfaces of the lower tandem cells. The partially assembled monolithic photovoltaic cell is then cleaved or otherwise separated, from the wafer. The semiconducting material forming the upper tandem cell is then selectively sectioned and metallized so that it forms an upper tandem subcell circuit with at least one photovoltaic cell. The upper tandem subcell circuit is connected in parallel across the lower tandem subcell circuit to complete the assembly of the monolithic cell.

The cells forming the monolithic photovoltaic cell of this invention can be easily fabricated so that, when the cells are connected together, the upper tandem subcell circuit is voltage matched with the lower tandem subcell circuit. An advantage of the voltage-matched nature of the upper and lower tandem subcell circuits is that the voltage change of any individual cell is proportional to the first-order to the log of changes in short circuit current through the cell. In other words, voltage changes occur relatively slowly compared to current changes. Consequently, the monolithic photovoltaic cell of this invention is capable of generating a relatively constant voltage for extended periods of time even though the current output of one or more of the individual cells may decay as a result of exposure to the ambient environment.

The inverted method of manufacturing the monolithic photovoltaic cell of this invention provides a convenient and economically efficient means to fabricate, as a single unit, the upper and lower tandem cells of this invention. There are also advantages associated with providing CuInSe$_2$/CdZnS lower tandem cells and forming the isolation layer of ZnSe. When the CuInSe$_2$ layer is grown on the wafer, some of the copper diffuses into the adjacent ZnTe backplane. The copper serves to increase the dopant concentration in the backplane, increasing its conductivity. The ZnSe isolation layer, in addition to serving as a dielectric barrier, also functions as a diffusion barrier that prevents copper from the ZnTe backplane from diffusing into the GaAs upper tandem cell where it can adversely affect the current-generating performance of that cell.

DETAILED DESCRIPTION OF THE PREFERRED EMBODIMENT

Figure 1:
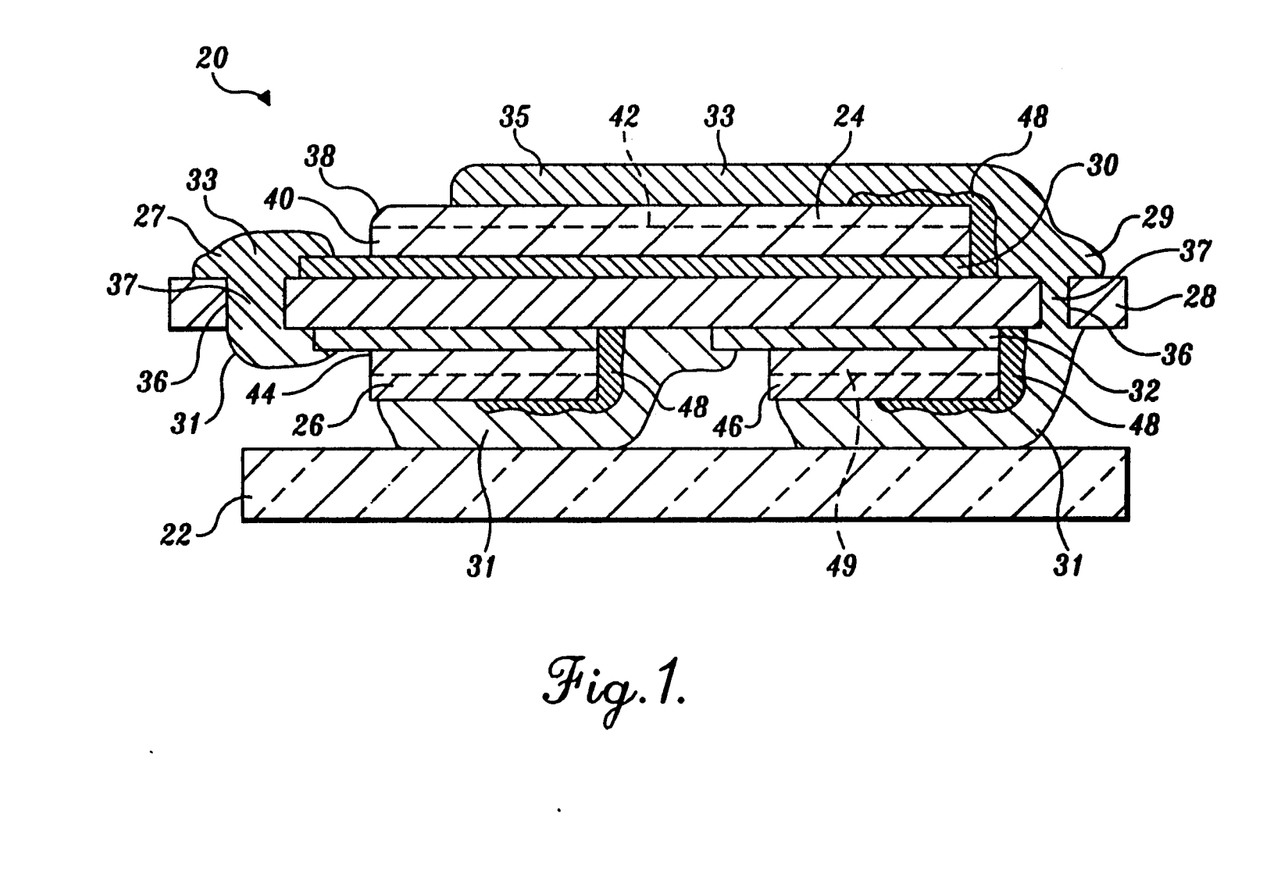
FIG. 1 is a sectional view of a monolithic photovoltaic cell of this invention.
Figure 2A:
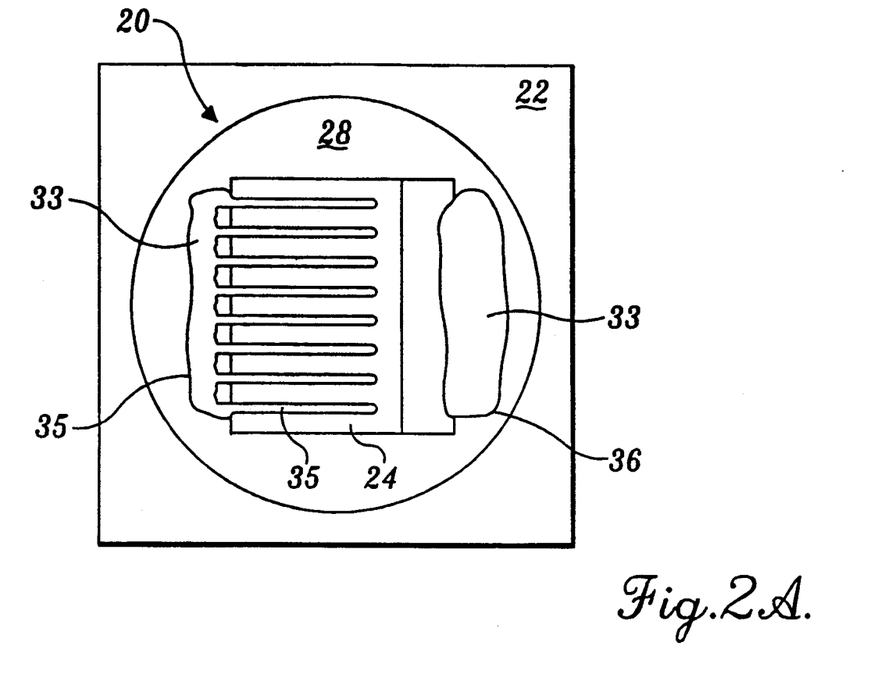
FIGS. 2A and 2B are top and bottom views, respectively, of the photovoltaic cell of this invention.
Figure 2B:
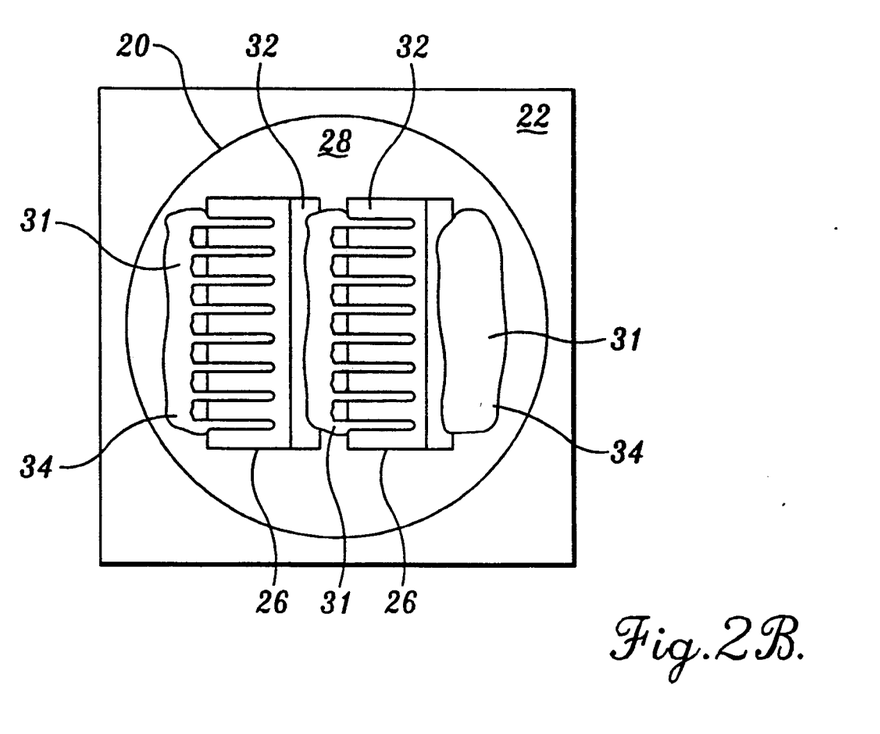

FIGS. 1, 2A, and 2B illustrate a monolithic photovoltaic cell 20 of this invention bonded to a glass substrate 22. Cell 20 includes an upper cell 24 that forms a one-cell upper tandem subcell circuit. A pair of lower cells 26 located below the upper cell 24 are series connected together to form a single-string lower tandem subcell circuit. The upper and lower cells, 24 and 26, respectively, are attached to the opposed sides of a transparent intrinsic isolation layer 28 that serves to electrically separate the cells. A transparent conductive backplane 30 located between the upper cell 24 and the isolation layer 28 includes an exposed, extended section that serves as a conductive terminal for upper cell 24. A pair of spaced-apart transparent conductive backplanes 32, each located between a separate one of the lower cells 26 and the isolation layer 28, each have an exposed, extended section that serves as an electrical terminal from the associated cell 26. A lower metallization layer 31, depicted by widely spaced crosshatching, connects the lower cells 26 in series so that they form the single-string subcell circuit, a multi-cell array. An upper metallization layer 33, depicted by narrowly spaced crosshatching, is selectively formed on the upper cell 24 to form grid lines 35 that extend across the surface of the cell. Upper metallization layer 33 is also selectively formed on the isolation layer to form contact pads, 27 and 29, respectively, that are spaced away from the upper cell 24. Upper metallization layer 33 is further disposed in vias 36 formed in the isolation layer 28 to form via plugs 37. The via plugs 37 connect the lower and upper metallization layers, 31 and 33, respectively, so that the subcell circuits forming the monolithic cell 20 function together as a voltage-matched power supply circuit.

In one preferred embodiment of this monolithic photovoltaic cell 20, upper cell 24 is an aluminum gallium arsenide (Al$_x$Ga$_{1-x}$As) homojunction photocell that includes an n-region 38 closest to the top surface of the cell 20 and a p-region 40 located below the n-region. (As used herein, the top, or upper, portion of the monolithic photovoltaic cell 20 is understood to be the portion of cell 20 that is initially struck by light.) Dashed line 42 represents the pn-junction of upper cell 24. The lower cells 26 are heterojunction cells wherein a layer of copper indium diselenide (CuInSe$_2$) forms a p-region 44 located closest to isolation layer 28, and a layer of cadmium zinc sulfide (CdZnS) forms an n-region 46 located below the p-region 44. Dashed lines 49 represent the pn-junctions of the lower cells 26. Isolation layer 28 is formed of zinc selenide (ZnSe) or zinc sulfide selenide (ZnS$_x$Se$_{1-x}$). Backplane 30, located between p-region 40 of upper cell 24 and isolation layer 28, is formed of aluminum gallium arsenide (Al$_x$Ga$_{1-x}$As) to function as a p$^+$ conductive layer. Backplanes 32, between isolation layer 28 and the p-regions 44 of the lower cells 26, are formed of zinc telluride (ZnTe). During fabrication of monolithic photovoltaic cell 20, copper from the adjacent p-regions 44 diffuses into the ZnTe backplanes 32 to enhance the conductivity of the backplanes. Nickel-copper or nickel-aluminum bilayers are both suitable material for forming the metallization layers 31 and 33.

Lower cells 26 are series connected by applying the lower metallized layer 31 between the bottom surface of the n-region 46 of a first cell and an exposed portion of the backplane 32 of the second cell. Lower metallization layer 31 is also formed over the n-region 46 of the second lower tandem cell 26 and an adjacent portion of the isolation layer 28. The upper and lower tandem cells 24 and 26, respectively, are connected in parallel by applying the upper metallization layer 33 between an exposed portion of the upper cell backplane 30 and the adjacent via 36, that via being formed over the backplane 32 of the first lower tandem cell 24. The via plug 37 formed thereby connects the backplane 30 of the upper tandem cell with the backplane 32 of the first lower tandem cell 26. Upper metallization layer 33 is further applied between the top surface of the upper tandem cell n-region 38 and the via 36 adjacent thereto. The via plug 37 formed thereby connects the portions of the n-region 38 of the upper cell 24 with the n-region 46 of the second lower cell 26. A small coating of dielectric material 48 is applied to the lateral surfaces of the cells 24 and 26 to which the metallization layers, 31 and 33, respectively, are applied in order to prevent the metallization from forming short circuits across the cells.

One method of manufacturing monolithic photovoltaic cell 20 of this invention is depicted in FIGS. 3A-3D. The cell 20 is grown on a monocrystalline substrate 60 formed of GaAs. The semiconductor material that comprises cell 20 is formed on wafer 60 in the inverted state wherein the upper cell 24 is formed first, isolation layer 28 is formed second, and, finally, the lower cells 26 are formed. Once the lower cells 26 are metallized, cell 20 is cleaved, separated, from wafer 60 for the final fabrication processes. U.S. Pat. No. 4,727,047, entitled "Method of Producing Sheets of Crystalline Material," to Bozler et al., and incorporated herein by reference, discloses one method for growing semiconducting material on a base wafer and separating the wafer.

Figure 3A:
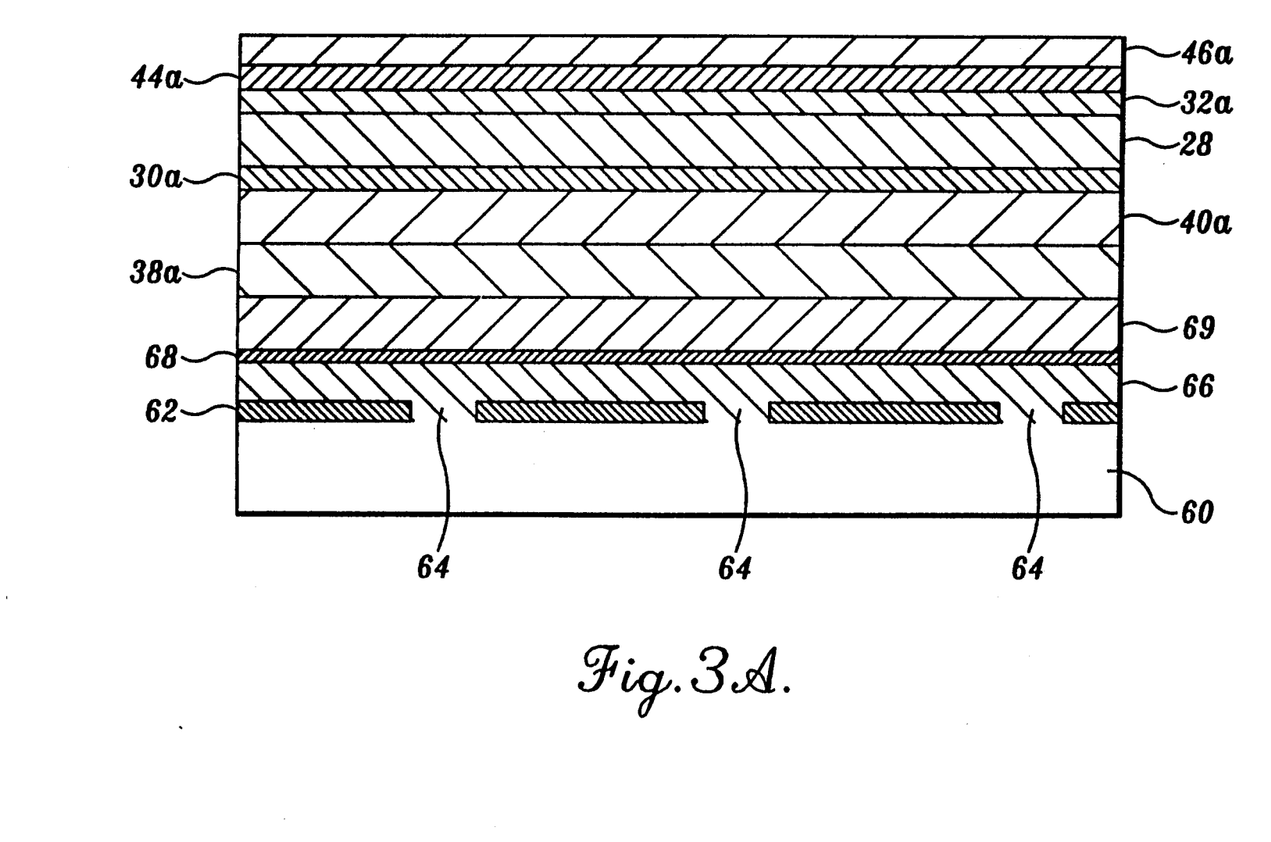
FIGS. 3A-3D are sectional views that illustrate how the photovoltaic cell of this invention is fabricated.

As depicted by FIG. 3A, fabrication of photovoltaic cell 20 starts with the application of a separation layer 62 to the surface of the wafer 60. The separation layer 62 is formed from a carbonized photoresist mask material that serves as a barrier against crystalline growth. Separation layer 62 is actually a single-plane, multisectional layer wherein the individual sections are separated enough to define slits 64 through which crystal growth can occur. After separation layer 62 is applied, wafer 60 is subjected to a first epitaxial growth process wherein semiconducting material is grown on the underlying substrate of the wafer so that the new layer has a crystalline lattice structure identical to the lattice structure of the underlying substrate. Epitaxial growth of semiconducting material is typically accomplished by placing the wafer 60 in a chamber, heating it to a relatively high temperature (at least 200° C.), and introducing a gas that includes atoms or molecules of the type to be grown on the wafer. The atoms/molecules that come in contact with the wafer 60 crystalize thereon to form the next layer.

Initially, a GaAs buffer layer 66 is grown on the wafer 60 and over the top of the separation layer. Buffer layer 66 is approximately one micrometer thick and is formed to provide a defect-free surface on which the subsequent layers can be formed. The buffer layer 66 is grown over the separation layer in two separate processes. Initially, an arsenic chloride vapor-phase epitaxial growth is used to form the buffer layer wherein $AsCl_3$ is employed as the carrier gas to transport the GaAs to the surface of the wafer. In this process, buffer layer 66 is grown in spaced-apart portions on the surfaces of wafer 60 exposed by slits 64. Once buffer layer 66 rises above separation layer 64, it is allowed to grow over the sections forming the separation layer. The growth of buffer layer 66 is then controlled so that the spaced-apart sections can merge together to form a monocrystalline layer. Once the individual sections of buffer layer 66 merge together an organometallic vapor-phase epitaxial growth process is used to form the remainder of the layer. In this process a gas such as hydrogen is employed as the carrier gas to transport the GaAs to the surface of the wafer. An etch stop layer 68 is then disposed over the buffer layer 66 for purposes to be described hereinafter. The etch stop layer may be formed of AlAs and may be applied to the wafer by vapor-phase deposition.

After the etch stop layer 68 is applied, a contact layer 69 is epitaxially grown on the wafer 60. The contact layer 69 is the first, or upper, layer of the upper cell 24 that is located immediately below the grid lines 35. The contact layer 69, while not shown in FIG. 1, is a part of the upper cell 24 in that it serves as a conductive bridge between the n-region 38 of the cell and the grid lines 35. Contact layer 69 is in the form of $Al_xGa_{1-x}As$ that is heavily doped with tellurium (Te) or other electron-rich dopant such as selenium (Se) or sulfur (Se). The contact layer 69 is more highly doped than the adjacent n-region 38 of the upper cell 24. In some preferred versions of this invention, contact layer 69 has a carrier concentration between $10^{19}$ and $10^{20}$ atoms/cm$^3$.

The remainder of the $Al_xGa_{1-x}As$ upper cell 24 is then grown on the wafer 60 during a set of organometallic vapor-phase epitaxial growth processes. Initially, an n-doped layer 38a is formed by growing an $Al_xGa_{1-x}As$ layer on the wafer wherein the $Al_xGa_{1-x}As$ is doped with electron-rich material such as Te or Se. The dopant concentration of this region may be between 3 and $15 \times 10^{17}$ atoms/cm$^3$. A p-doped layer 40a is formed over the n-doped layer 38a by growing an $Al_xGa_{1-x}As$ layer doped with zinc or other electron-poor dopant, wherein the dopant concentration is between $10^{18}$ and $10^{20}$ atoms/cm$^3$. The basic formation of the $Al_xGa_{1-x}As$ upper cell 24 is completed with the growth of a Zn-, Mg-, or C-doped $Al_xGa_{1-x}As$ layer 30a. The Zn, Mg, or C serves to highly dope the $Al_xGa_{1-x}As$ so that the layer can function as a conductor. It should be noted that the aluminum in the $Al_xGa_{1-x}As$ serves to increase the bandgap constant of the GaAs. This increases its infrared transparency and also better matches its structure to that of the adjacent ZnSe layer. Thus, it should be understood that the upper cell 24 may be formed of $Al_xGa_{1-x}As$, wherein the aluminum concentration may vary between layers of the cell and, for some or all layers, may even be zero. A more complete discussion of how the upper cell structure is grown can be found in R. Gale et al., "High Efficiency Double-Heterostructure AlGaAs/GaAs Solar Cells," *Conf. Proceedings of the 18th IEEE PV Specialists Conf.*, (IEEE, N.Y., 1985) p. 296, which is incorporated herein by reference. This article, for example, suggests that a high-efficiency $Al_xGa_{1-x}As$ cell can be fabricated, wherein the cell actually has a double-heterostructure construction such that the cell has an n-region formed with $Al_xGa_{1-x}As$, a p-region adjacent the n-region formed solely of GaAs, a first p$^+$-region formed of $Al_xGa_{1-x}As$, and on the opposed side of the p-region, a second $p^+$-region formed of GaAs.

Isolation layer 28 is then formed over backplane 30 using a physical vapor-deposition growth process. Zinc selenide is a preferred material for forming the isolation layer 28 because, in addition to being electrically non-conductive, it is very closely lattice matched with the adjacent $Al_xGa_{1-x}As$ layer 30a. This match means that the atoms of ZnSe isolation layer 28 are approximately the same distance apart from each other as are the atoms forming the $Al_xGa_{1-x}As$ layer 30a. An advantage of close lattice matching is that it reduces the defects that develop in the cell during the epitaxial growth process. The difference, or lattice mismatch, of the ZnSe with the $Al_xGa_{1-x}As$ is relatively low, approximately 0.2 to 0.3%. In alternative embodiments of the invention, isolation layer 28 may be formed of $ZnS_xSe_{1-x}$, which has a lattice mismatch with $Al_xGa_{1-x}As$ even lower than that of ZnSe. Another advantage of forming isolation layer 28 of ZnSe is that this material serves as a barrier to prevent copper from the subsequent fabrication steps from diffusing into the $Al_xGa_{1-x}As$ upper cell 24 where it could significantly degrade the performance of the cell. In still other embodiments of the invention, aluminum could be added to the isolation layer 28 since it can strengthen the diffusion barrier against the copper. In these versions of the invention, the isolation layer will be formed of ZnSe:Al or $ZnS_xSe_{1-x}$:Al. Since, however, the ZnSe functions as an isolation layer, neither n- nor p-dopants are added to this layer to enhance its conductivity. Either chemical or physical vapor-deposition techniques can be employed to grow the isolation layer 28 on the wafer 60. In a manufacturing process, it may be preferable to use chemical vapor-deposition techniques to form the isolation layer 28. Alternatively, molecular beam epitaxy, which is a physical vapor-deposition process for growing semiconducting material, can be used to form the ZnSe isolation layer 28 over the bottom surface of the upper cell backplane 30.

Following formation of isolation layer 28, a ZnTe layer 32a is formed on wafer 60 covering the surface of wafer 60. The ZnTe is deposited on wafer 60 using chemical vapor-deposition or physical vapor-deposition techniques. In order to enhance the conductive qualities of backplane layer 32a, the ZnTe may be doped with a Group I metal, such as copper, or a Group V element, such as antimony or phosphorous. The dopant concentration may be in the range of $10^{18}$ to $10^{22}$ atoms/cm$^3$. As will be described with respect to the following step, copper may be diffused into the ZnTe layer 32a during the fabrication of the $CuInSe_2$/CdZnS lower cells 26.

Fabrication of the $CuInSe_2$/CdZnS lower cells 26 starts with the growth of a single p-type layer 44a over backplane layer 32a. To prevent the copper in the $CuInSe_2$ forming p-type layer 44a from diffusing through backplane layer 32a and isolation layer 28 into the AlGaAs upper cell 24, the growth process should occur at temperatures between 250° and 400° C. and, more ideally, at temperatures between 250° and 300° C. In order to epitaxially grow the $CuInSe_2$ p-doped layer 44a on the ZnTe layer 32a, the layer is grown using a photoassisted chemical or physical vapor-deposition process. In these processes, wafer 60 is placed in a transparent epitaxial growth chamber and strong light is shone on the wafer when the epitaxial growth constituents are introduced into the chamber. The light shone on the wafer typically is of the visible or ultraviolet wavelength.

Alternatively, low-temperature, $CuInSe_2$ epitaxial growth is achieved by plasma-assisted epitaxial growth. According to this process, the $CuInSe_2$ layer is grown in a chamber in which a plasma is formed to activate the selenium source. The plasma is formed by the ionization of gas, such as $H_2$, by the application of electromagnetic energy to the gas. In one preferred method of manufacture, a microwave electron cyclotron resonator (ECR) is used to plasmatize the gas. The ECR emits at least 10 watts of power at approximately 2.45 GHz. In alternative manufacturing processes, the ECR may be employed to emit energy at higher frequencies. An advantage of the plasma-assisted growth of this method is that, at this frequency, the ionization energy of the gas is typically in the range of tens of volts as opposed to the 100-volt-plus ionization energy of gas to which energy at radio frequencies (13.56 MHz) is applied. Moreover, the plasma-assisted growth of this method makes it possible to epitaxially grow $CuInSe_2$ using selenium instead of hydrogen selenide, which is more dangerous to work with.

During the formation of the p-doped layer 44a on the ZnTe layer 32a, a portion of the copper will diffuse into the ZnTe. This copper serves to dope the ZnTe so that it will serve as a conductor. Moreover, since the ZnTe layer 32a readily serves as a host for the copper, only a small fraction of the copper attempts to diffuse through the ZnSe layer 28a. Since the amount of copper that attempts to diffuse through the ZnSe layer 28a is so small, the chemical potential of the ZnSe is typically strong enough to form a barrier that prevents essentially any copper from diffusing into the adjacent AlGaAs layers.

After p-doped layer 44a is grown, the layering of semiconducting material on wafer 60 is completed by the growth of a CdZnS n-doped layer 46a on top of the p-doped layer. Cadmium sulfide (CdS) by itself forms a photovoltaic junction with $CuInSe_2$. A $Zn_{0.13}Cd_{0.87}S$ alloy of ZnS and CdS is used as the n-region because it is well lattice matched with $CuInSe_2$. Layer 46a is grown by thermally evaporating the ZnS and CdS in order to form the molecules needed to be epitaxially attached to the wafer.

Figure 3B:
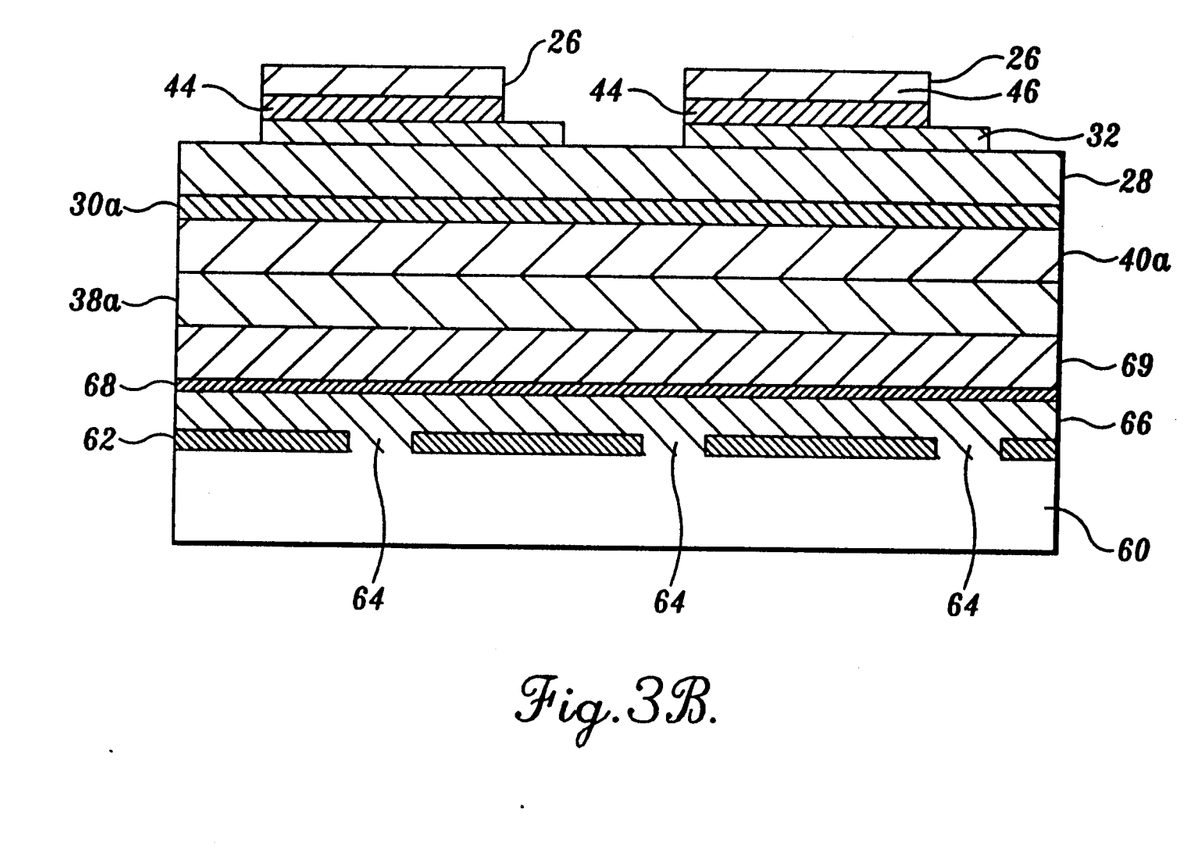

Once all the layers of semiconducting material are grown on wafer 60, lower cells 26 are formed as depicted in FIG. 3B. Initially, the top of the wafer 60, the bottom of the partially manufactured monolithic photovoltaic cell 20, is selectively etched to separate the $CuInSe_2$ and CdZnS layers, 44a and 46a, respectively, into the separate current-producing portions of the lower cells 26. The etching method used to separate the $CuInSe_2$/CdZnS layers must not react with the underlying ZnTe, since a portion of each backplane 32 must extend away from the cell 26 with which it is associated. Ion beam etching may be used to effect the $CuInSe_2$/CdZnS removal. Alternatively, chemical etchants may be employed to shape the $CuInSe_2$/CdZnS portions of the cells 26. The following may be suitable etchants for removing unwanted $CuInSe_2$ and CdZnS layers: $FeCl_3$ in a wafer at approximately 42° Baumé concentration; a solution of 10 to 20% $Cr_2O_2$, 20 to 30% $H_2SO_4$, and 50 to 70% water; or, $(NH_4)_2S_2O_8$ in water at 1 gm/10 ml. The unwanted portions of the $CuInSe_2$ and CdZnS layers, 44a and 46a, respectively, are removed by exposing those portions of wafer 60 to an etchant for a period of approximately 30 seconds to 5 minutes. A more preferred period for exposing wafer 60 to the etchant for removing the unwanted material is from 45 seconds to 3 minutes.

After the CuInSe$_2$ and CdZnS layers, 44a and 46a, respectively, are etched, the ZnTe layer 32a is etched to form the individual backplanes 32. Ion beam etching may be employed to define the backplanes 32. Alternatively, etchants such as hydrofluoric acid or nitric acid may be used to remove the unwanted ZnTe but leave the ZnSe isolation layer 28. The formation of the backplanes 28 completes the formation of the individual lower tandem cells 26.

Figure 3C:
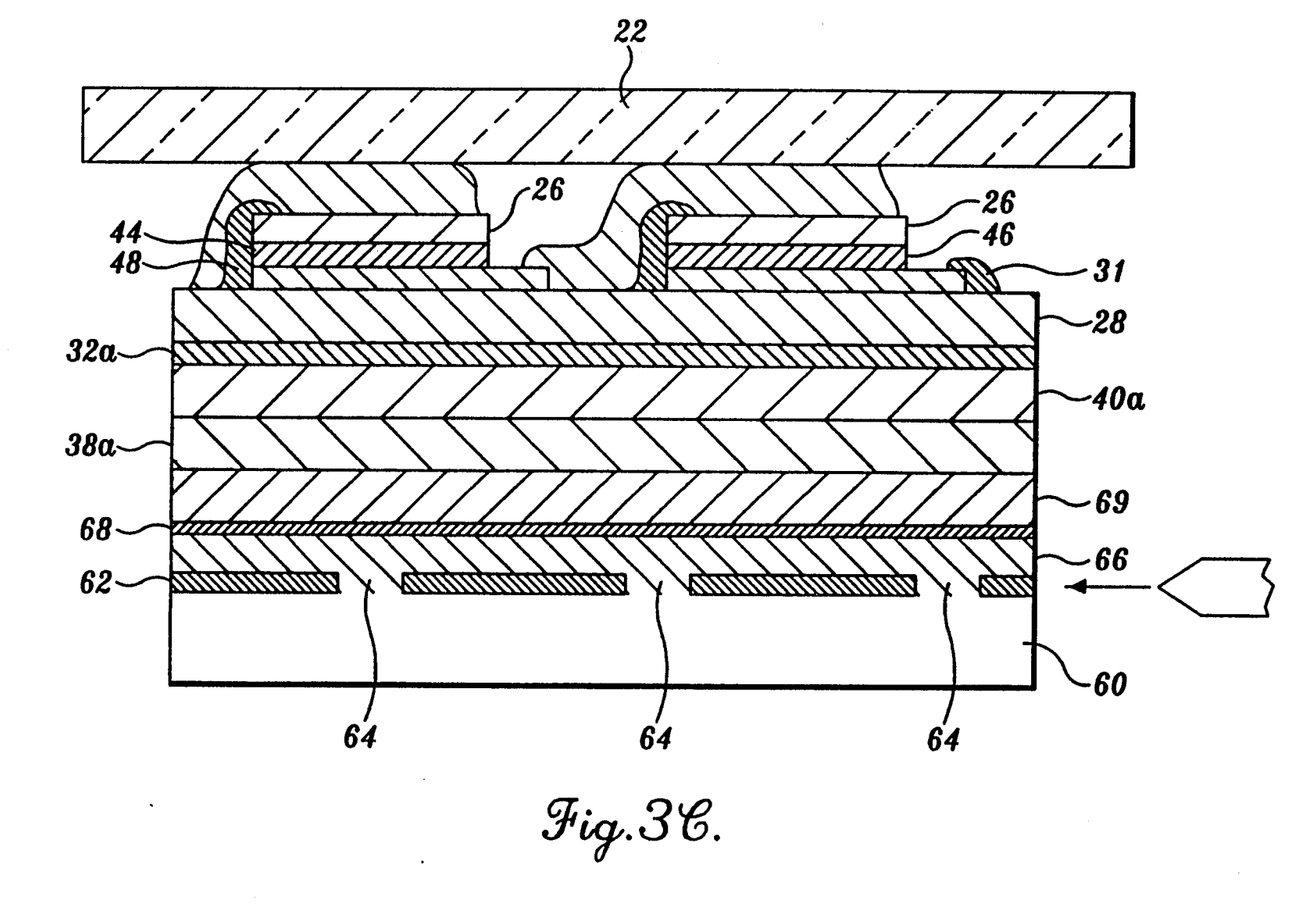

Once the individual lower cells 26 are formed, the cells 26 are series connected as depicted by FIG. 3C. Initially, dielectric material 48 is applied to the lateral edges of the lower cells 26 over which a subsequent metallization layer will be applied. Silicon oxide, SiO$_2$, is a suitable nonconductive material that can be applied to monolithic photovoltaic cell 20 as the dielectric material. The SiO$_2$ is selectively applied to the wafer 60 using conventional semiconductor deposition techniques. After dielectric material 48 is deposited, metallization layer 31 is applied to the top of the wafer to series connect the cells 26 and to provide connections to which the later-formed upper cell 24 can be connected. As depicted by FIG. 3C, lower cells 26 are series connected by applying, or post-application patterning, metallization layer 31 such that one section of the metallizing material extends from the exposed surface of the n-region 44 of a first cell to the exposed portion of the backplane 32 of the second cell. Interconnection of the lower cells 26 completes the fabrication of the lower portion of the monolithic cell 20.

Glass substrate 22 is then secured to the top of wafer 60, the bottom of partially fabricated monolithic photovoltaic cell 20, by electrostatic bonding. Substrate 22 is electrostatically bonded to wafer 60 by charging the substrate positively, negatively charging the wafer metallization layer 31, and then bringing the substrate in contact with the wafer 60. In one type of electrostatic bonding process, the metals and ions at the interface of metallization layer 31 and substrate 20 interdiffuse between the substrate and metallization layer to bond the substrate to the wafer. In another form of electrostatic bonding, the buildup of charge causes the formation of an aluminum oxide layer (not shown) on the metallization layer 31. The aluminum oxide diffuses into the substrate 22 to bond the substrate to the wafer. After substrate 22 is bonded to wafer 60, the partially assembled photovoltaic cell 20 and the substrate are separated from the base of the wafer by cleaving all of the wafer above separation layer 62 from the wafer. This cleavage is accomplished by applying a suitable wedge to the side of the wafer along an axis coplanar to separation layer 62.

Figure 3D:
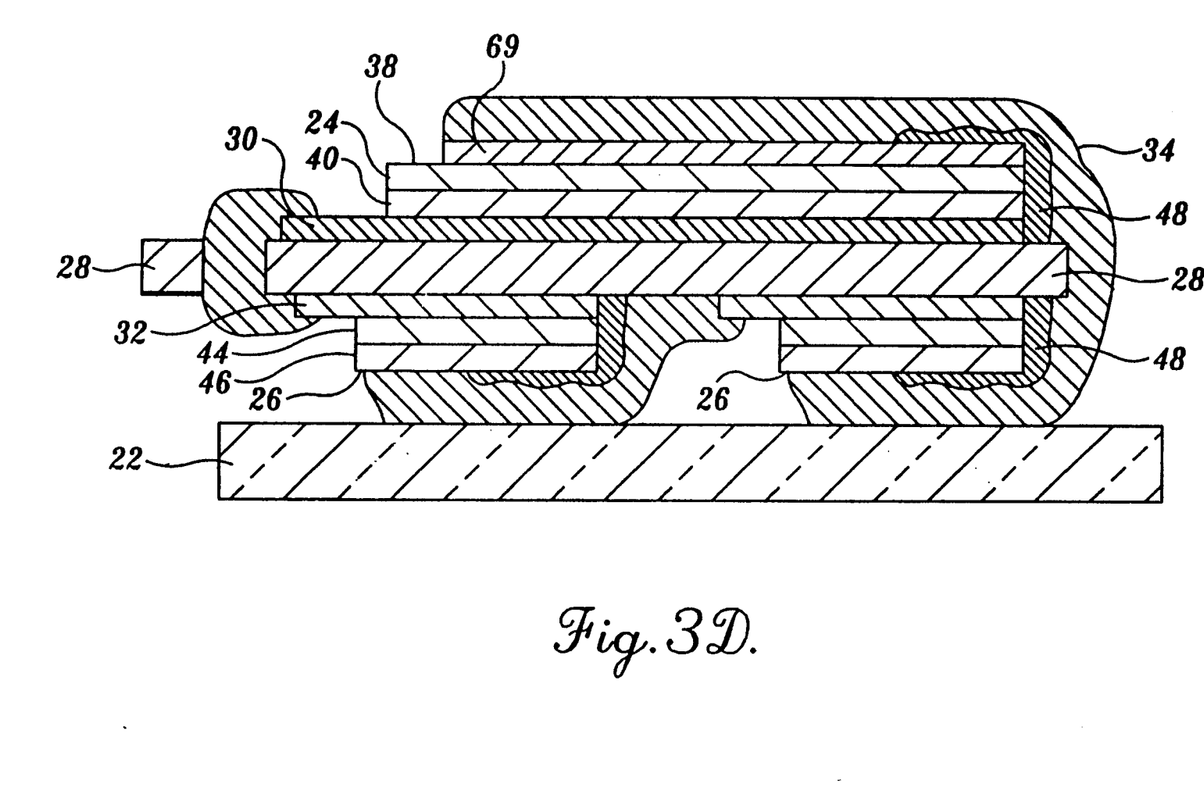

Partially assembled monolithic cell 20 is then inverted so that it is in upright orientation relative to the direction from which light will strike the completed cell, as depicted by FIG. 3D. Buffer layer 66 is removed by an etching process that removes the AlGaAs down to the etch stop layer 68. Etch stop layer 68 is removed using an appropriate solvent, such as NH$_4$OH:H$_2$O$_2$. Then, either solvent etching or ion beam etching is used to selectively remove sections of the contact layer 69, the n-doped layer 38, and the p-doped layer 40. The selective removal of these layers serves to give the basic, current-generating, portion of the upper cell 24 the desired dimensions. During this process, portions of the underlying AlGaAs layer 30a are exposed. A separate etching step is then used to selectively remove portions of the exposed AlGaAs layer to form the backplane 30 with the desired dimensions.

At this time, the ZnSe forming the isolation layer 28 may be selectively removed to give it the desired dimensions and to form vias 36 through the layer. Dielectric material 48 is then applied to the AlGaAs upper cell 24 to cover portions of the fabricated cell 24 where the junction between the n-layer 38 and p-layer 40 will be covered by the metallization layer 33. Metallization layer 33 is then applied to the top of the AlGaAs upper cell 24 to cover the whole of the contact layer 69. The metal forming the metallization layer 33 is applied in such a manner to form via plugs 37 that provide a conductive path to metallization layer 31 on the underside of the cell 20. Metallization layer 33 is then selectively removed from the top of the AlGaAs upper cell 24 to establish conductive grid lines 35 that define interstitial spaces through which light can strike the cell. The portions of the contact layer 69 not disposed underneath the grid lines 35 are removed from the AlGaAs upper cell 24 to expose the underlying n-region 38. An antireflective coating (not shown), such as tantalum pentoxide (Ta$_2$O$_5$) may then be applied to the top of the AlGaAs upper cell 24 between metallization grid lines 35.

It should be understood that, in the foregoing, illustrations of the material forming monolithic photovoltaic cell 20 are not intended to be representative of the relative thickness of the material forming the cell 20. The top metallization layer 31 forming the grid lines 35 and the underlying contact layer 69 of the assembled monolithic photovoltaic cell have a combined thickness of approximately 1 to 5 mils. The n-region 38 of the adjacent AlGaAs upper tandem cells has a depth of between 0.03 and 1.0 micrometers; the adjacent p-region 40 is approximately 0.5 to 5.0 micrometers wide. Backplane 30 is approximately 1.0 to 5.0 micrometers deep. The ZnSe isolation layer 28, though serving as a dielectric and copper diffusion barrier, is only between 1.0 and 10.0 micrometers wide. The ZnTe backplanes 32 are approximately 1.0 to 5.0 micrometers deep. The CuInSe$_2$ p-regions 44 of the lower cells 26 are approximately 0.5 to 5.0 micrometers wide; the CdZnS n-regions 46 are 0.03 to 3.0 micrometers wide. The portion of the metallization layer 31 on the bottom of the cell 20 is approximately 0.1 to 5.0 mils thick. The dielectric material 48 disposed between the cells 24 and 26 and the metallization layer ranges in depth from 0.1 micrometers to 5 mils. In one preferred version of monolithic photovoltaic cell 20, the AlGaAs upper cell 24 has a width of approximately 4 to 10 cm and a length of approximately 1 to 3 cm; the CuInSe$_2$/CdZnS lower cells 26 are each approximately 4 to 10 cm in width and 0.3 to 1.5 cm in length.

The AlGaAs upper cell 24 of the described embodiment of this invention has a bandgap energy of approximately 1.4 to 1.7 eV. The actual bandgap energy is a function of the amount of Al added to the cell during its growth. The CuInSe$_2$/CdZnS lower cells 26 have a bandgap energy of approximately 1.0 eV. When monolithic photovoltaic cell 20 is exposed to light, such as light emitted by the sun, short-wavelength light, light having a wavelength of approximately 300 to 900 nm, is absorbed by the upper cell 24 and converted into energy. It further is understood that the wavelength of light absorbed by the AlGaAs cell 24 is a function of its bandgap energy; in some versions of the invention the longest wavelength of light that cell 24 may absorb may only be 700 nm. Light having longer wavelengths, such as wavelengths of approximately 700 to 1300 nm, is not absorbed by the upper cell 24. Instead, upper cell 24 is transparent to this light. This light passes through the upper cell 24, the backplane 30, the isolation layer 28, and the backplanes 32 to the lower cells 26 where it is absorbed by these cells and converted into electrical energy. In one version of this invention, when light strikes monolithic photovoltaic cell 20, the AlGaAs upper cell 24 develops a potential of between 1.0 and 1.6 volts; the CuInSe$_2$/CdZnS lower cells 26 each develop a potential of between 0.4 and 0.6 volts. The lower cells 26 are series connected so that their individual potentials are cumulative and are of a magnitude equal to or greater than the potential developed across the upper cell 24. Thus, with the parallel connection of upper cell 24 across the series-connected lower cells 26, the monolithic photovoltaic cell 20 of this invention functions as a voltage-matched, multicell photovoltaic power source.

In some versions of this invention, upper cell 24 is capable of producing a current flow of approximately 0.068 to 1.05 amps and the lower cells 26 produce a current flow of approximately 0.023 to 0.51 amps. Since the current flow out of the parallel-connected sources is cumulative, the monolithic photovoltaic cell 20 of the described embodiment of the invention is generating between 0.08 and 1.2 watts of power.

An advantage of monolithic photovoltaic cell 20 of this invention is that the voltage of the individual cells 24 and 26 will change only slightly as a result of any changes in the cell's current-producing capabilities. Consequently, photovoltaic cell 20 is able to continually produce a relatively constant voltage even though individual upper and lower tandem cells, 24 and 26, respectively, forming cell 20 may decay at varying rates. Moreover, relatively straightforward processes are involved in the manufacture of the individual upper and lower tandem cells, 24 and 26, respectively, to ensure that they are appropriately voltage matched. Another advantage of the preferred embodiment of the invention is that the ZnSe semiconducting material forming the isolation layer performs two functions. It serves as an electrical isolation layer between the upper and lower tandem cells. Secondly, it has an electrochemical potential that inhibits the copper in the adjacent CuInSe$_2$ layer 44a from diffusing into the AlGaAs layers and degrading the performance of the upper cell 24.

There are also certain advantages associated with manufacturing monolithic photovoltaic cell 20 in an inverted state. Wafer 60 provides a stable substrate upon which the lower cells 26 can be fabricated integrally with the upper cell 24. Also, while forming the p-region 44 of the lower cells 26 of CuInSe$_2$, a source of copper is provided that can be diffused into the lower ZnTe backplane 32 to enhance the conductivity of the backplane. Moreover, since the ZnTe serves as a ready host that absorbs copper, it serves to minimize the amount of copper that attempts to diffuse through the ZnSe. This enhances the ZnSe layer's ability to block the diffusion of copper into the AlGaAs upper cell 24. Moreover, another advantage of the photovoltaic cell 20 of this invention is that the lower cells 26 are constructed wherein the CuInSe$_2$ p-regions 44 form the top surface of the CuInSe$_2$/ZnS cell so that the light strikes the CuInSe$_2$ region first. The advantage of the cell construction is that carrier formation occurs relatively close to the pn-junction 49.

Figure 4:
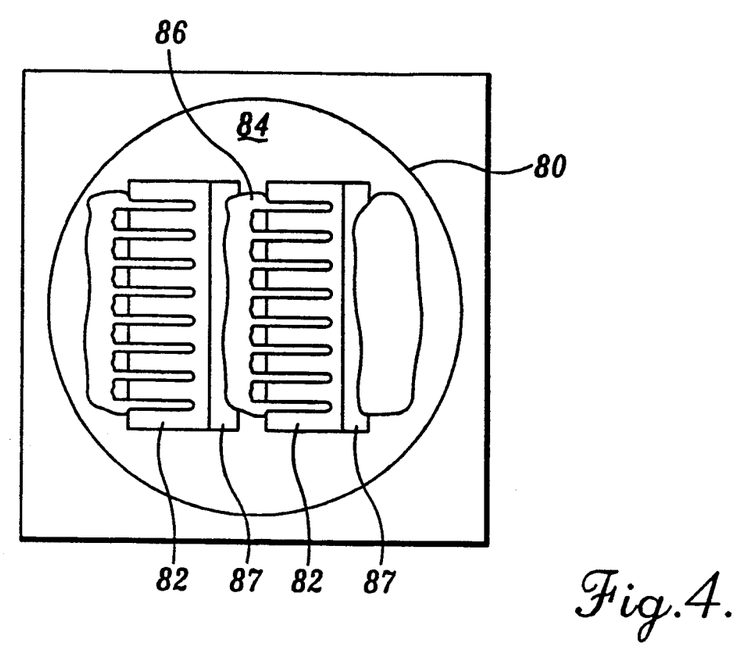
FIG. 4 is a plan view of an alternative monolithic photovoltaic cell of this invention.
Figure 5:
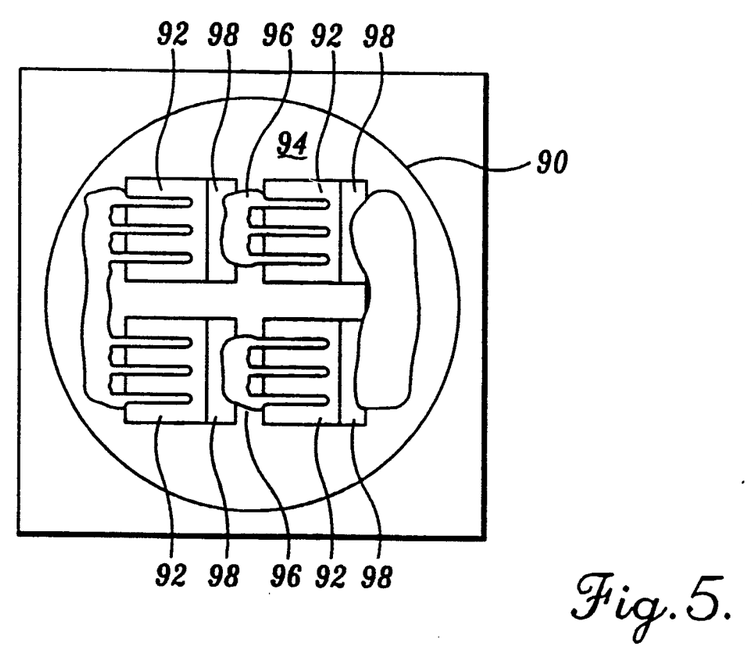
FIG. 5 is a bottom view of still another alternative photovoltaic cell of this invention.

As depicted by FIGS. 4 and 5, there is no requirement that the photovoltaic cells of this invention all be provided with just a single upper tandem cell that is connected in parallel across the lower tandem cells. FIG. 4 depicts a top view of an alternative monolithic photovoltaic cell 80 of this invention that includes two series-connected upper tandem cells 82 that are disposed on the top surface of an isolation layer 84. In this embodiment of the invention, the upper tandem cells 82 collectively form the upper tandem subcell circuit. In this embodiment of the invention, one portion of a metallization layer 86 is used to provide a conductive path between a backplane 87 integral with one of the upper tandem cells 82 and the top surface of the adjacent cell. Other sections of metallization layer 86 are used to provide electrical connection between opposed terminals of the upper tandem cells 82 and a set of lower tandem cells (not shown) located underneath the isolation layer 84. In this manner, the ratio of upper cells to lower cells may be any convenient relationship such as, for example, 2:3, 3:5, or any other ratio necessary to establish a voltage-matched relationship between the upper and lower tandem cells. As depicted by FIG. 5, it may even be desirable to provide video a monolithic photovoltaic cell 90 of this invention with lower tandem cells 92, some of which are connected first, in multiple-series strings and, secondly, so that the individual strings are in parallel with each other to form the lower tandem subcell circuit. In the illustrated version of the invention, cells 92 are disposed in a 2×2 array on an isolation layer 94. A metallization layer 96 is selectively applied to the bottom of the cells 92 and their associated backplanes 98 to provide the desired series and parallel connections. It may also be desirable to provide versions of this invention wherein two or more of the upper tandem cells are connected in parallel. Those cells may be connected in parallel with the lower tandem cells or may be series connected with other sets of upper tandem cells.

Figure 6:
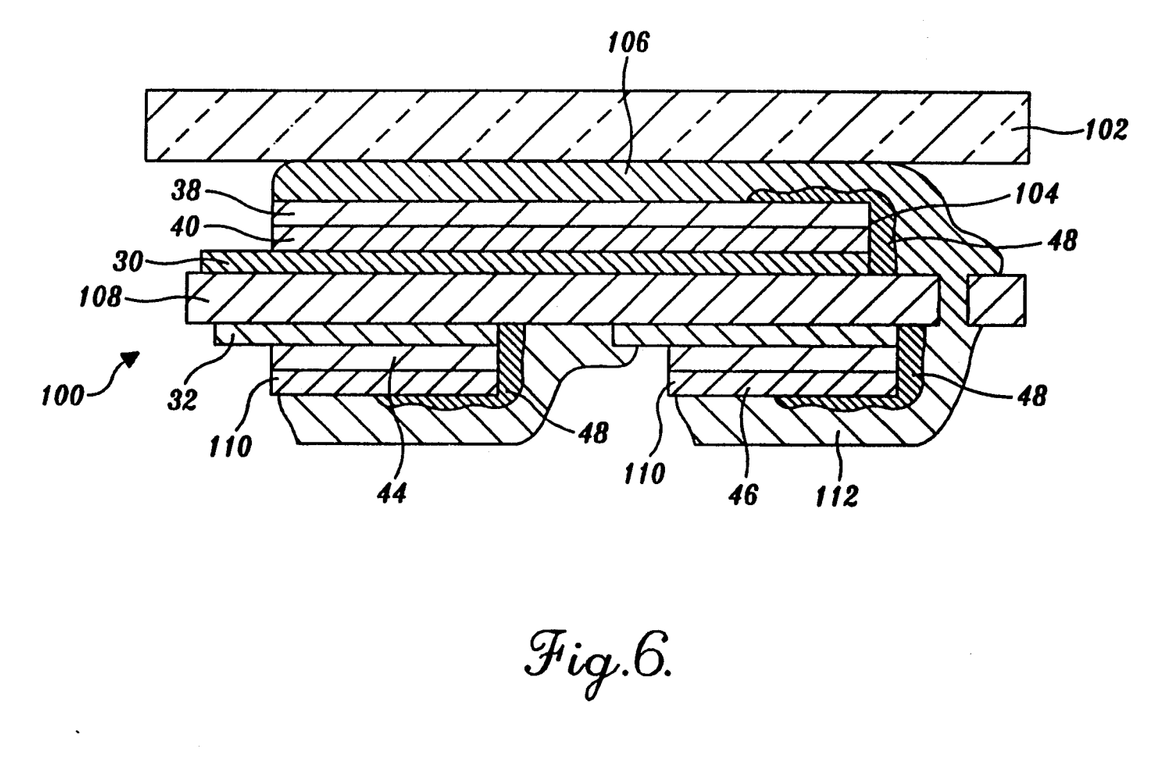
FIG. 6 is a sectional view of an alternative construction of a monolithic photovoltaic cell of this invention.

FIG. 6 depicts an alternative monolithic photovoltaic cell 100 of this invention wherein the cell is mounted on a transparent superstrate 102. Manufacture of monolithic photovoltaic cell 100 starts with the formation of an upper tandem cell 104 on the top of the wafer according to the processes described with respect to the first-discussed method of cell manufacture. After the upper tandem cell 104 is grown, the cell 104 is then patterned into the appropriate shape and the desired metallization grid 106 is formed thereon. At this time, partially assembled monolithic photovoltaic cell 100 and superstrate 102 are cleft from the wafer on which the cell 100 is grown. The cell 100 and superstrate 102 are then inverted. An isolation layer 108 is then grown on top of the exposed surface of the upper tandem cell 104, which is the bottom of the cell 104. Lower tandem cells 110 are first grown and then patterned on the exposed surface of the isolation layer 108. After the lower tandem cells 110 are patterned, a second metallization layer, metallization layer 112, is selectively applied to the lower tandem cells 110 to series connect the lower tandem cells 110 together and to connect those cells in parallel across the upper tandem cell 104. The lower metallization process completes the manufacture of the cell 100. The cell 100 and superstrate 102 assembly are then inverted so that the cell can be activated by exposure to light.

The foregoing description has been limited to specific embodiments of the monolithic photovoltaic cell of this invention and methods of fabricating the same. It will be apparent, however, that various modifications can be made to the invention with the attainment of some or all of the advantages thereof. For example, there is no requirement that in each version of the invention the upper tandem cells be formed of AlGaAs or that the lower tandem cells be formed of heterojunction CuInSe$_2$/CdZnS cells. Alternative photovoltaic cells of this invention can be manufactured wherein upper tandem cells are formed of material such as GaInP and/or the lower tandem cells are formed of material such as Ge or Si. The lower tandem cells may be further formed of material that has inherent bypass diode qualities, to prevent the individual cell from becoming a power sink that reduces the overall output of energy generated by the monolithic cell. U.S. patent application Ser. No. 07/840,509, filed Feb. 24, 1992, entitled "Photovoltaic Cell With Inherent Bypass Diode," by Fraas and Avery, incorporated herein by reference, discusses the advantages of such cells and further identifies the material from which they can be formed. Furthermore, there is no requirement that the p-regions of the upper and lower subcell circuits always be the regions closest to the isolation layer. In some versions of the invention, the photovoltaic cells forming the upper and lower subcells may be arranged so that their n-regions are closest to the isolation layer. Alternatively, there may be some constructions of the monolithic photovoltaic cell of this invention wherein the p-regions of a first subcell circuit are located closest to the isolation layer and the n-region of the second subcell circuit is located closest to the isolation layer.

Similarly, material forming the backplanes for the intrinsic isolation layer may differ from what has been identified in the application. For example, the intrinsic isolation layer for some photovoltaic cells of this invention may be formed of ZnS, CdZnSSe, or GaP. Similarly, in some versions of this invention, it may be desirable to provide a multilayer isolation layer where one or more layers are used because they have desired dielectric qualities, while other layers are used because they serve as diffusion barriers to semiconducting material forming other parts of the cell.

Furthermore, the method of manufacture of the monolithic photovoltaic cells is similarly subject to change. There may be instances when neither plasma epitaxial growth nor photoassisted chemical- or vapor-deposition epitaxial growth is required to bond the material forming the lower tandem cells to the material forming the associated backplane and that other methods of epitaxial growth, such as molecular beam epitaxy, may be employed. In a similar vein, other methods of growing other layers of semiconducting material forming the photovoltaic cell of this invention may be used when appropriate. Also, other methods may be employed to remove the partially fabricated cell from the underlying substrate. One such method is disclosed in U.S. Pat. No. 4,846,931, entitled "Method for Lifting-Off Epitaxial Films," to Gmitter et al., and is incorporated herein by reference. This method involves forming the cell over a thin release layer, applying a thin support layer under tension over the partially fabricated cell, and selectively etching away the release layer, which causes the edges of the cell to curve upwardly, away from the substrate. It should similarly be understood that the disclosed method of manufacture of allowing the copper of the CuInSe$_2$ layer to diffuse into the ZnTe layer in order to enhance the conductivity of the ZnTe backplanes may be used to fabricate photovoltaic devices other than those disclosed herein.

Therefore, it is the object of the appended claims to cover all such modifications and variations that come within the true spirit and scope of the invention.

The embodiments of the invention in which an exclusive property or privilege is claimed are defined as follows:

1. A monolithic photovoltaic cell comprising: a patterned dielectric isolation layer having first and second opposed sides; an upper cell integrally bonded to said first side of said isolation layer; at least two lower cells integrally bonded to said second side of said isolation layer; and a metallization coating selectively attached to said upper and lower cells to connect said lower cells in series with each other and to connect through the pattern of the isolation layer said lower cells in parallel across said upper cell, wherein said upper cell and said isolation layer are transparent to light absorbed by said lower cells and said upper and lower cells are formed so that said lower cells develop a voltage at least approximately equal to the voltage developed across said at least one upper cell.

2. The photovoltaic cell of claim 1, wherein: each said lower cell includes a current-producing section including a pn-junction and a conductive backplane located between said current-producing section and said isolation layer wherein said backplane is transparent to light absorbed by said lower cells and includes an exposed section extending away from said cell current-producing section; and said series connection of said lower cells is established by a first section of said metallization coating that extends between said backplane extended section of a first one of said lower cells and said current-producing section of a second one of said lower cells.

3. The photovoltaic cell of claim 2, wherein: said upper cell includes a current-producing section including a pn-junction and a backplane located between said current-producing section and said isolation layer wherein said backplane is transparent to light absorbed by said lower cells and includes an exposed section extending away from said upper cell current-producing section; and said parallel connection of said upper cell to said lower cells is established by a second section of said metallization coating extending between said current-producing section of said upper cell and said current-producing section of said first one of said lower cells and a third section of said metallization coating extending between said upper cell backplane extended section and said second lower cell backplane extended section.

4. The monolithic photovoltaic cell of claim 2, wherein said lower cell backplanes are formed from a transparent semiconducting material.

5. The monolithic photovoltaic cell of claim 4, wherein said lower cell backplanes are formed from ZnTe doped with copper.

6. The photovoltaic cell of claim 1, wherein: said upper cell includes a current-producing section including a pn-junction and a backplane located between said current-producing section and said isolation layer wherein said backplane is transparent to light absorbed by said lower cell and includes an exposed section extending away from said upper cell current-producing section; and said parallel connection of said upper cell to said lower cells is established by a first section of said metallization coating extending between said upper cell current-producing section and a first one of said lower cells and a section of said metallization coating extending between said upper cell backplane extended section and a second one of said lower cells.

7. The monolithic photovoltaic cell of claim 1, wherein said isolation layer is formed from ZnSe, $ZnS_xSe_{1-x}$, ZnSe:Al, or $ZnS_xSe_{1-x}$:Al.

8. The monolithic photovoltaic cell of claim 1, wherein said upper cell is an $Al_xGa_{1-x}As$ photovoltaic cell.

9. The monolithic photovoltaic cell of claim 8, wherein said lower cells are $CuInSe_2$/CdZnS photovoltaic cells.

10. The monolithic photovoltaic cell of claim 9, wherein said isolation layer is formed from ZnSe, $ZnS_xSe_{1-x}$, ZnSe:Al, or $ZnS_xSe_{1-x}$:Al.

11. The cell of claim 9 wherein the $CuInSe_2$ is adjacent a backplane on the isolation layer so that the lower cells are inverted.

12. The cell of claim 8, wherein said $Al_xGa_{1-x}As$ photovoltaic cell is formed with an n-region and p-region, and wherein said n-region and said p-region have different concentrations of aluminum.

13. The monolithic photovoltaic cell of claim 12, wherein at least one of said n- or p-regions forming said $Al_xGa_{1-x}As$ photovoltaic cell is substantially aluminum free.

14. The monolithic photovoltaic cell of claim 1, wherein said metallization coating extends through at least one via defined by an opening in said isolation layer.

15. The monolithic photovoltaic cell of claim 1, further including at least two upper cells located on said first side of said isolation layer wherein said upper cells are connected in series with each other.

16. The monolithic photovoltaic cell of claim 1, further including at least three series-connected lower cells.

17. A method of manufacturing a monolithic photovoltaic cell including the steps of:
   epitaxially growing a first layer of semiconducting material capable of generating an electric current in response to exposure to light on a substrate of semiconducting material;
   epitaxially growing a dielectric isolation layer on said first layer;
   epitaxially growing a second layer of semiconductor material capable of generating an electric current in response to exposure to light on said isolation layer;
   patterning said second layer to form at least two spaced-apart lower photovoltaic cells;
   applying a layer of metallization on said lower cells to series connect said at least two lower cells;
   attaching a substrate to said metallized lower cells to form a first layer of semiconducting material/isolation layer/lower tandem cell/substrate subassembly;
   separating said first layer of semiconducting material/isolation layer/lower tandem cell/substrate subassembly from said semiconductor material substrate;
   patterning said first layer of semiconducting material to form an upper cell; and
   applying a metallization layer to said upper cell across said isolation layer to parallel connect said upper cell across said series-connected lower cells.

18. The method of forming a monolithic photovoltaic cell according to claim 17, further including the steps of:
   epitaxially growing a first transparent conductive layer between said first layer of current-generating semiconducting material and said isolation layer;
   epitaxially growing a second transparent conductive layer between said isolation layer and said second layer of current-generating semiconducting material;
   patterning said second conductive layer so that said layer forms a plurality of conductive backplanes wherein each said backplane is disposed between a separate one of said lower cells and said isolation layer and further includes an extended section extending away from said lower cell with which it is associated;
   series connecting said lower cells by selectively applying said metallization layer in a first conductive path between said backplane extended section of a first one of said lower cells and said current-generating semiconductor material of a second one of said lower cells;
   patterning said first conductive layer so that said layer forms a conductive backplane between said upper cell and said isolation layer wherein said backplane includes an extended section extending away from said upper cell; and
   connecting said upper cell in parallel across said at least two lower cells by applying a second metallization layer between said current-generating semiconductor material of said upper cell and said current-generating semiconductor material of said first one of said lower cells and by applying said metallization layer in a third conductive path between said backplane extended section of said upper cell and said backplane extended section of said second one of said lower cells.

19. The method of forming a monolithic photovoltaic cell of claim 18, wherein said upper cell/lower cell/substrate subassembly is separated from said semiconductor material substrate after said first conductive path is applied between said first and second lower cells.

20. The method of forming a monolithic photovoltaic cell of claim 18, wherein:
   said second transparent conductive layer is formed from semiconductor material; and
   said second layer of current-generating semiconductor material includes a sublayer of semiconductor material grown on said second transparent conductive layer that includes a metal, wherein said sublayer is grown on said second transparent conductive layer semiconducting material so that said sublayer metal diffuses into said second transparent conductive layer.

21. The method of forming a monolithic photovoltaic cell of claim 20, wherein said second layer of current-generating material is grown on said second conductive layer at a temperature below that at which said second layer of current-generating material metal will diffuse through said isolation layer.

22. The method of forming a monolithic photovoltaic cell of claim 20, wherein said second layer of current-generating material adjacent said second transparent conductive layer is grown on said second transparent conductive layer at a temperature less than 400° C.

23. A photovoltaic cell made by the method of claim 18.

24. The method of forming a monolithic photovoltaic cell of claim 17, wherein said first layer of current-generating semiconductor material is formed from $Al_xGa_{1-x}As$, wherein said $Al_xGa_{1-x}As$ is selectively formed on said semiconductor material substrate to have a p-region and an n-region adjacent said p-region.

25. The method of forming a photovoltaic cell of claim 24, wherein said $Al_xGa_{1-x}As$ semiconducting material is selectively formed on said semiconductor material substrate so that said p-region and said n-region have different aluminum concentrations.

26. The method of forming a photovoltaic cell of claim 25, wherein said $Al_xGa_{1-x}As$ semiconducting material is selectively formed on said semiconductor material substrate so that at least one of said n- or p-regions of said $Al_xGa_{1-x}As$ semiconducting material is substantially aluminum free.

27. The method of forming a monolithic photovoltaic cell of claim 24, wherein:

said $Al_xGa_{1-x}As$ n-region is initially formed on said wafer, said $Al_xGa_{1-x}As$ p-region is formed over said AlGaAs n-region; and said second layer of current-generating semiconductor material comprises a sublayer of $CuInSe_2$ forming a p-region and a sublayer of CdZnS forming an n-region, wherein said $CuInSe_2$ sublayer is formed initially and said CdZnS sublayer is formed over said $CuInSe_2$ sublayer.

28. The method of forming a monolithic photovoltaic cell of claim 17, wherein said second layer of current-generating semiconductor material comprises a sublayer of $CuInSe_2$ forming a p-region and a layer of CdZnS forming an n-region formed adjacent each other.

29. A photovoltaic cell made by the method of claim 17.

30. The cell of claim 29, wherein the upper cell is an $Al_xGa_{1-x}As$ cell, and said at least two lower cells are $CuInSe_2$/CdZnS cells.

31. A photovoltaic cell manufactured according to the steps of:

epitaxially growing a first layer of semiconducting material capable of generating an electric current in response to exposure to light on a substrate of semiconducting material;

epitaxially growing a dielectric isolation layer on said first layer;

epitaxially growing a second layer of semiconducting material capable of generating an electric current in response to exposure to light, on said isolation layer;

patterning said second layer to form at least two spaced-apart lower photovoltaic cells;

applying a metallic layer on said lower photovoltaic cells to series connect said at least two lower photovoltaic cells;

attaching a substrate to said lower photovoltaic cells to form a first layer of semiconducting material/isolation layer/lower tandem cell/substrate subassembly;

separating said first layer of semiconducting material/isolation layer/lower tandem cell/substrate subassembly from said semiconducting material substrate;

patterning said first layer of semiconducting material to form an upper cell; and applying a metallic layer to said upper cell across said isolation layer to parallel connect said upper cell with said two lower photovoltaic cells.

32. The photovoltaic cell of claim 31, wherein a first transparent conductive backplane is located between said upper cell and said isolation layer and a set of second transparent conductive backplanes is located between separate ones of said lower photovoltaic cells and said isolation layer; and wherein said metallic layer is applied to form a first conductive path between said backplane associated with a first one of said lower photovoltaic cells and said current-generating material of a second one of said lower cells to form said lower cell series connection, a second conductive path between said current-generating material of said first one of said lower photovoltaic cells and said current-generating material of said upper cell, and a third conductive path between said upper cell backplane and said backplane associated with said second one of said lower photovoltaic cells.

33. A monolithic photovoltaic cell manufactured according to the steps of:

forming a first current-producing region;

forming a transparent isolation layer on said first current-producing region;

forming a conductive transparent backplane on said isolation layer;

forming a second current-preoducing region on said backplane;

patterning said first current-producing region to form at least one first photovoltaic cell, patterning said second current-producing region to form at least one second photovoltaic cell; and applying a metallic layer to electrically connect said first and second photovoltaic cells together;

wherein materials forming said transparent backplane and said second current-producing region are selected so that, when said second current-producing region is formed, a portion of said material forming said second current-producing region diffuses into said transparent backplane to improve the conductivity of said backplane.

34. The photovoltaic cell of claim 33, wherein said transparent backplane is formed from ZnTe.

35. The photovoltaic cell of claim 34, wherein said second current-producing region is at least partially formed from $CuInSe_2$.

36. A monolithic, voltage-matched, GaAs/$CuInSe_2$ tandem solar cell, comprising:

(a) at least one GaAs, photoactive, transparent cell epitaxially grown over a transparent, conductive backplane on a first side of a first transparent isolation layer;

(b) a plurality of series-connected, inverted CdZnS/$CuInSe_2$, photoactive cells epitaxially grown over a second transparent, conductive backplane on a second side of the transparent isolation layer, wherein the $CuInSe_2$ is adjacent the second backplane and the CdZnS is removed from the second backplane; and (c) metalizations to connect the GaAs cell in parallel with the plurality of CdZnS/$CuInSe_2$ to achieve voltage matching.

37. The tandem solar cell of claim 36 wherein the second backplane is ZnTe doped with copper.

* * * * *